United States Patent
Betz et al.

(10) Patent No.: US 11,955,175 B2
(45) Date of Patent: Apr. 9, 2024

(54) COPY REDUNDANCY IN A KEY-VALUE DATA STORAGE SYSTEM USING CONTENT ADDRESSABLE MEMORY

(71) Applicant: Micron Technology, Inc., Boise, ID (US)

(72) Inventors: Tyler L. Betz, Meridian, ID (US); Tecla Ghilardi, Trescore Balneario (IT); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/729,989

(22) Filed: Apr. 26, 2022

(65) Prior Publication Data
US 2022/0375522 A1    Nov. 24, 2022

Related U.S. Application Data

(60) Provisional application No. 63/201,914, filed on May 18, 2021.

(51) Int. Cl.
*G11C 15/04* (2006.01)
*G11C 11/406* (2006.01)
(Continued)

(52) U.S. Cl.
CPC ........ *G11C 15/04* (2013.01); *G11C 11/40615* (2013.01); *G11C 11/4093* (2013.01); *G11C 11/4096* (2013.01)

(58) Field of Classification Search
CPC .......... G11C 11/40615; G11C 11/4093; G11C 11/4096
See application file for complete search history.

(56) References Cited

U.S. PATENT DOCUMENTS 7,848,129 B1 * 12/2010 Deshpande ............ G11C 15/04
                                                 365/49.1
8,402,226 B1    3/2013 Faibish
(Continued)

*Primary Examiner* — Connie C Yoha
(74) *Attorney, Agent, or Firm* — LOWENSTEIN SANDLER LLP

(57) ABSTRACT

A memory system includes a memory device comprising a value data block a content addressable memory (CAM) block storing a plurality of stored search keys. The memory system further includes a processing device that receives an input search key, identifies, from the plurality of stored search keys in a CAM block of a memory device, multiple redundant copies of a stored search key that match the input search key, and determines a plurality of locations in a value data block, the plurality of locations corresponding to the multiple redundant copies, wherein one of the plurality of locations comprises a first timestamp and data representing a value associated with the input search key, and wherein a remainder of the plurality of locations comprises one or more additional timestamps. The processing device further determines whether the first timestamp matches the one or more additional timestamps, and responsive to the first timestamp matching the one or more additional timestamps, retries from the one of the plurality of locations, the data representing the value associated with the input search key.

20 Claims, 8 Drawing Sheets

(51) Int. Cl.
  *G11C 11/4093*   (2006.01)
  *G11C 11/4096*   (2006.01)

(56) References Cited

U.S. PATENT DOCUMENTS

| | | | |
|---|---|---|---|
| 8,913,412 B1 | 12/2014 | Khanna | |
| 2009/0190404 A1 | 7/2009 | Roohparvar | |
| 2010/0054012 A1* | 3/2010 | Srinivasan | G11C 15/00 |
| | | | 365/49.17 |
| 2013/0111160 A1 | 5/2013 | Benhase | |
| 2013/0198445 A1 | 8/2013 | Bando | |
| 2013/0246698 A1 | 9/2013 | Estan | |
| 2014/0136758 A1 | 5/2014 | Sprouse | |
| 2015/0039823 A1* | 2/2015 | Chen | G06F 16/90339 |
| | | | 711/108 |
| 2018/0188958 A1 | 7/2018 | Kim | |
| 2018/0247694 A1* | 8/2018 | Wickeraad | G11C 15/00 |
| 2020/0202932 A1 | 6/2020 | You | |
| 2022/0359011 A1* | 11/2022 | Betz | G11C 15/04 |

* cited by examiner

COPY REDUNDANCY IN A KEY-VALUE DATA STORAGE SYSTEM USING CONTENT ADDRESSABLE MEMORY

RELATED APPLICATION

This application claims the benefit of U.S. Provisional Patent Application Ser. No. 63/201,914, filed May 18, 2021.

TECHNICAL FIELD

Embodiments of the disclosure relate generally to memory sub-systems, and more specifically, relate to copy redundancy in a key-value data storage system using content addressable memory (CAM) in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
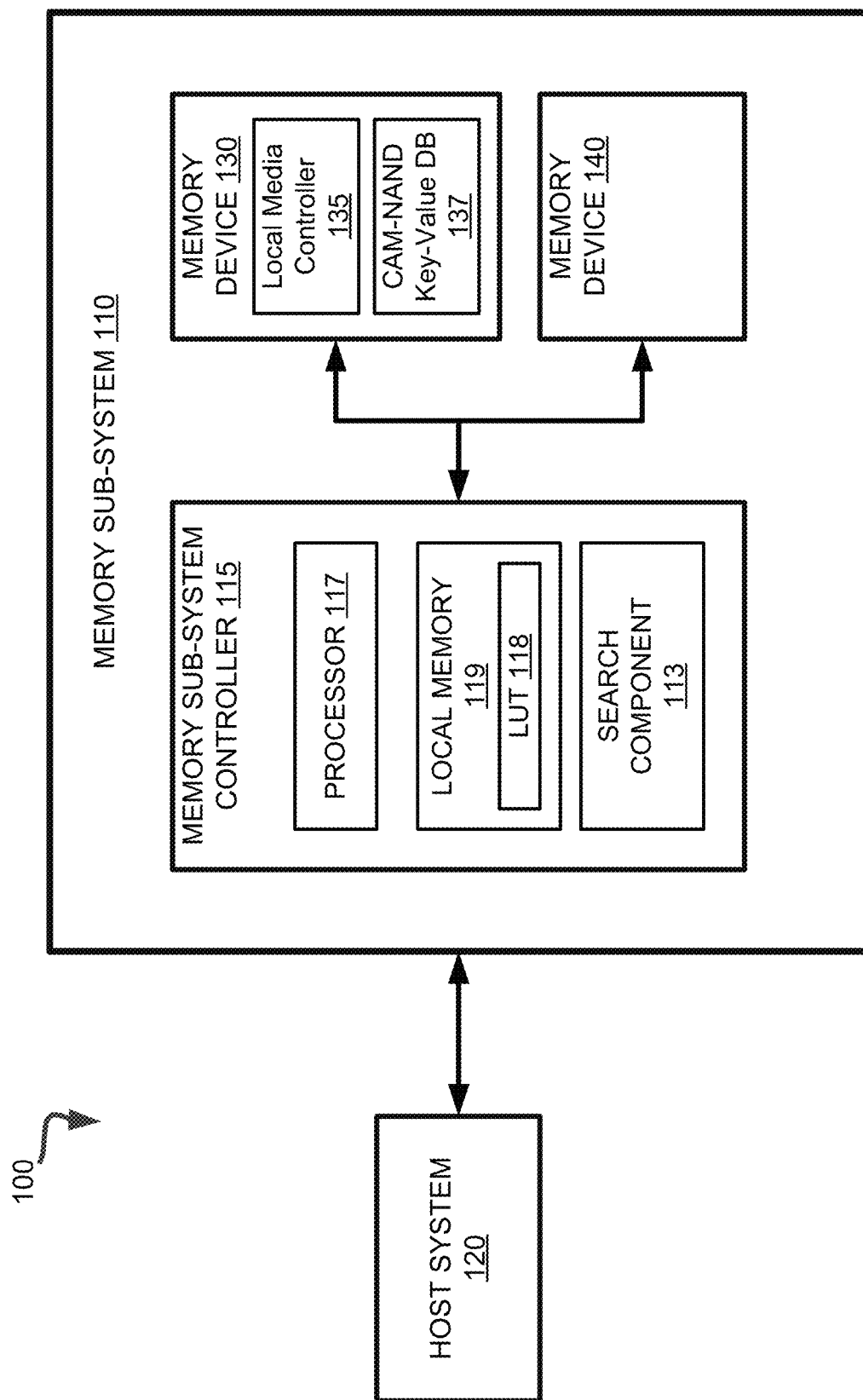
FIG. 1 illustrates an example computing system that includes a memory sub-system in accordance with some embodiments of the present disclosure.

Aspects of the present disclosure are directed to copy redundancy in a key-value data storage system using content addressable memory (CAM) in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A content addressable memory (CAM) is a type of memory device that is often used in certain very high speed searching applications such as identifier (ID) and pattern matching. Generally, a CAM is searched by comparing input search data against a table of stored data entries and a memory address of matching data in the table is returned. CAMs are frequently implemented in dynamic random-access memory (DRAM), or synchronous random-access memory (SRAM). Both DRAM and SRAM, however, have a limited memory capacity, which limits the amount of data that can be stored and searched in conventional CAM implementations.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A string is a unit in a NAND-type flash memory device. NAND-type flash memory devices typically have 32 or more memory cells, where each memory cell is used to represent a bit value (e.g., 0 or 1). Thus, a string with 32 memory cells can represent 32 bits of data and a string with 64 memory cells can represent 64 bits of data. In a NAND-type flash memory block, individual strings are connected to allow storage and retrieval of data from selected cells. Typically, strings in the block are connected at one end to a common source line and at the other end to a bit line. Each string also contains two control mechanisms in series with the memory cells. String and ground select transistors are connected to the string select line and ground select line. Memory cells in NAND-type flash components are connected horizontally at their control gates to a word line to form a page. A page is a set of connected memory cells that share the same word line and are the minimum unit to program. NAND-type flash memory devices may have page sizes of 64K or 128K cells. Although conventional NAND-type flash memory has a larger capacity than DRAM and SRAM, it is generally too slow for serial data searching and access.

A key-value data storage system is designed for storing, retrieving, and managing a collection of records. Each record can include different fields, holding one or more values. The records are stored in a database and retrieved using a key that uniquely identifies the record, and can be used to find the record within the database. In contrast to relational databases, in a key-value data storage system, the data (i.e., the values) are stored as a single opaque collection, which can be formatted differently in every record. This flexibility of not being tied to a defined schema allows the key-value data storage systems to utilize far less memory than relational databases. Random access memories, such as DRAM or SRAM, do not provide the density or capacity to store all the data in large key-value systems. Certain key-value systems utilize a CAM architecture implemented in a NAND-type flash memory device to provide both fast and high capacity search capability. Consistent with this architecture, data entries can be stored on strings of a NAND-type flash memory array. A search pattern representing an input search word is input vertically on each word line corresponding to a string in the array of the CAM. In one embodiment, the input search word represents a search key utilized in the key-value data storage system. A single read operation compares the input search word (i.e., the search key) with all strings in the selected portion of the array, typically a sub-block in one or more planes, and identifies a storage address of matching data (i.e., a stored key). When only a single copy of the stored key is maintained in the CAM, however, any defect, error, or other corruption of the data will prevent the stored key matching the input search key from being identified. Thus, since only the CAM is searched for the presence of the stored key, and the corresponding value store (e.g., implemented in NAND-type flash memory, or other non-volatile memory, which is not arranged using a CAM architecture) is not searched separately, the requested data can go unidentified in response to a query despite the actual presence of that data in the value store. This occurrence can be referred to as a "false negative." It is also possible for the inverse occurrence (i.e., a "false positive") to occur if a memory cell that was programmed to a high threshold voltage should lose its charge and cause a false match.

Aspects of the present disclosure address the above and other deficiencies by implementing copy redundancy in a key-value data storage system using content addressable memory (CAM). In one embodiment, multiple redundant copies of a stored key are maintained in the CAM. When an input search word (i.e., the search key) is received, it can be compared with each redundant copy of the stored key to determine a result. The location of the multiple copies can vary depending on the embodiment. For example, in one embodiment, the copies can be stored anywhere in the CAM (e.g., on different blocks) and the comparison can be performed by a memory sub-system controller separate from the memory device where the stored keys are maintained. In other embodiments, the copies can be stored in different sub-blocks associated with different respective page buffers or a single common page buffer, and the comparison can be performed on the memory device itself (i.e., "on-chip"). In another embodiment, the copies can be stored adjacent to one another in the same sub-block of the CAM array.

In one embodiment, the storage address(es) of the matching stored key(s) in the CAM can be used as the input to a lookup table or other data structure storing the location of corresponding entries in the separate value store. The value store can be implemented in NAND-type flash memory, or other non-volatile memory, which is not arranged using a CAM architecture. For example, a memory sub-system controller, or other control logic, can identify an entry in the lookup table corresponding to the storage address(es) of the matching stored key(s) in the CAM and determine, from that entry, associated locations in the value store where the data corresponding to the keys is located. In one embodiment, each of the multiple redundant copies of the stored key in the CAM is associated with a different location in the value store. In one embodiment, one location in the value store includes a value associated with the stored key and an associated timestamp (e.g., indicating a time at which the key/value pair was stored at the memory sub-system). Any other locations in the value store (i.e., those locations associated with the remaining redundant copies of the stored key) can include the same timestamp while not including the associated value. In one embodiment, control logic compares the timestamps from each location in the value store to determine whether they match. If all of the timestamps (e.g., 3 of 3 timestamps) from each location in the value store match (i.e., indicate the same time), the value associated with the matching stored keys can be returned to a requestor that originally provided the input search word (e.g., a host system coupled to the memory sub-system). If, for example, only a subset of the timestamps match (e.g., 2 of 3 timestamps), the value associated with the matching stored keys can be returned, and the CAM can be refreshed to address whatever change/error led to at least one timestamp not matching the other timestamps. If, for example, none of the timestamps match, the value associated with the matching stored keys is not returned and an error recovery flow is initiated, since there is low confidence that the value is correctly associated with the matching stored keys.

Advantages of this approach include, but are not limited to, improved performance in the memory sub-system. The NAND-based CAM architecture enables new applications where high speed and high-density pattern matching is performed, such as applications related to artificial intelligence, machine vision, and large genetic databases. Moreover, the search of the NAND-based CAM is conducted within the NAND component, and therefore, utilization of the system bus is significantly reduced (i.e., by one or more orders of magnitude). This relaxation of bus requirements can save power, increase system efficiency, and/or reduce system cost. Such a redundancy scheme ensures that, even if one or more of the multiple redundant copies of the stored key in the CAM are corrupted, a match with a received search key can still be identified so that the requested data can be retrieved from the corresponding location in the value store. In addition, the determination of matching timestamps further helps to identify and correct errors in the CAM, even though certain error-correcting codes (e.g., BHC or LDPC) are not available. Accordingly, less DRAM or other volatile memory is utilized to implement the functionality of the key-value data storage system which can reduce cost and power utilization in the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, memory device 130 can be configured to include a content addressable memory (CAM) NAND key-value database 137. As described in more detail below, the CAM-NAND key-value database 137 can include a CAM block of one or more arrays of memory cells organized as strings. Each string stores a data entry and comprises memory cells connected in series between a match line and a page buffer. That is, the CAM block includes multiple match lines and each match line is connected to one of multiple strings in an array. The match lines of the CAM block correspond to bit lines of the NAND block on which the CAM block is implemented. Within a given string, memory cells can be organized as complementary memory cell pairs. Each bit value of the data entry stored by a string is mapped to one of the complementary memory cell pairs in the string.

The CAM block can be searched by providing a search pattern as input to search lines of the CAM block. The search lines of the CAM block correspond to word lines of the NAND block on which the CAM block is implemented. In one embodiment, the match lines of the CAM block are precharged to facilitate searching. That is, prior to input of the search, a voltage signal is applied to the match lines of the CAM block. During a search operation, if the input search word (i.e., the search key) matches any data entry stored by the CAM block (i.e., one or more of multiple redundant copies of a stored key), one or more matched lines (e.g., match lines corresponding to strings storing the matching data entry) become conductive and discharge a signal in response to the search pattern input at the search lines. If the search word does not match any stored entry, all match lines are non-conductive. Each match line is further connected to a page buffer (e.g., comprises one or more latch circuits) that receives a discharge signal and stores data indicating that matched data is stored along the connected match line.

In one embodiment, memory sub-system 110 further includes a search component 113 that facilitates searching of the CAM-NAND key-value database 137. Consistent with some embodiments, the search component 113 is included in the in the memory sub-system controller 115, as shown. For example, the memory sub-system controller 115 can include the processor 117 (e.g., a processing device) configured to execute instructions stored in the local memory 119 for performing the operations of the search component 113 described herein. In some embodiments, memory device 130 includes at least a portion of the search component 113. In some embodiments, the search component 113 is part of the host system 120, an application, or an operating system.

The search component 113 generates a search pattern based on a received input search word and causes control logic (e.g., local media controller 135) to input the search pattern vertically along search lines of the CAM block in CAM-NAND key-value database 137. In one embodiment, the CAM block includes multiple redundant copies of a stored key, each stored as separate data entries. If one or more data entries matching the input search word are stored in CAM block, the search pattern causes a match line storing the data entry (also referred to as a "matched line") to become conductive and since the match lines are precharged, a matched line provides a signal to a connected page buffer that indicates that the search word is stored thereon. A location (e.g., a storage address) of any matching data entry may be identified based on the signal provided by the matched line as a result of the string being conductive. More specifically, a page buffer connected to any matched line stores data in response to detecting a discharge signal that indicates that the matched datum is stored along the matched line. In one embodiment, the page buffer itself can identify the match lines representing the number of redundant copies of the stored key that match the input search key. In another embodiment, a component of the search component 113 or control logic (e.g., a read-out circuit) may read data from the page buffer. Based on the data read from the page buffer, the search component 113 can identify the match lines and output a corresponding indication of whether the search word is stored by the CAM block and an indicator of the locations of the match lines.

Search component 113 can apply the location of the match line as an input to a lookup table 118, or other data structure. In one embodiment, the lookup table 118 is implemented in local memory 119 (e.g., DRAM) of memory sub-system controller 115. In other embodiments, the lookup table 118 can be maintained elsewhere in memory sub-system 110, including on memory device 130 (e.g., in NAND memory). Lookup table 118 can include a mapping or other correspondence between the location of the match line in the CAM block and a location of associated value (i.e., data or the address and/or address offset) in a value data block of CAM-NAND key-value database 137. In one embodiment, the value data block is implemented on memory device 130 using NAND-type flash memory (e.g., TLC memory or QLC memory), which is not arranged using a CAM architecture and is separate from the CAM block. Search component 113 can identify entries in the lookup table 118 corresponding to the locations of the match lines in the CAM block and determine, from those entries, associated locations in the value data block where the data corresponding to the keys are located.

In one embodiment, each of the multiple redundant copies of the stored key in the CAM block is associated with a different location in the value store. In one embodiment, one location in the value store includes a value associated with the stored key and an associated timestamp (e.g., indicating a time at which the key/value pair was stored at the memory sub-system). Any other locations in the value store (i.e., those locations associated with the remaining redundant copies of the stored key) can include the same timestamp while not including the associated value. In one embodiment, control logic compares the timestamps from each location in the value store to determine whether they match. If all of the timestamps (e.g., 3 of 3 timestamps) from each location in the value store match (i.e., indicate the same time), the value associated with the matching stored keys can be returned to a requestor that originally provided the input search word (e.g., host system 120). If, for example, only a subset of the timestamps match (e.g., 2 of 3 timestamps), the value associated with the matching stored keys can be returned, and the CAM can be refreshed to address whatever change/error led to at least one timestamp not matching the other timestamps. If, for example, none of the timestamps match, the value associated with the matching stored keys is not returned and an error recovery flow is initiated, since there is low confidence that the value is correctly associated with the matching stored keys. Further details with regards to the operations and structure of search component 113 and CAM-NAND key-value database 137 are described below.

Figure 2:
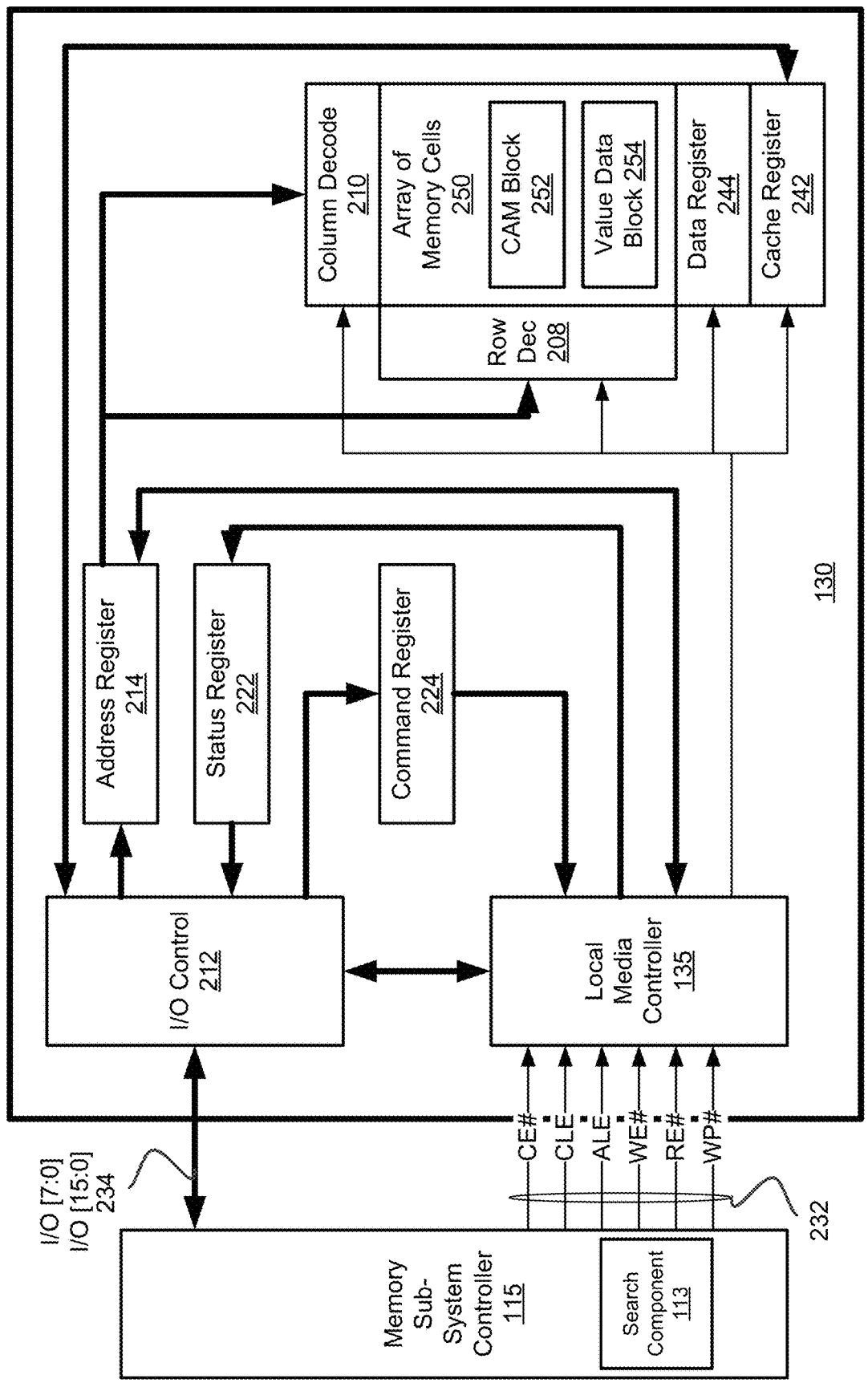
FIG. 2 is a block diagram of a memory device in communication with a memory sub-system controller of a memory sub-system in accordance with some embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 250 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 250 are capable of being programmed to one of at least two target data states. In one embodiment, the array of memory cells 250 includes CAM block 252 and value data block 254. As described herein, the CAM block 252 includes a number of stored keys stored vertically in strings to which a received search key can be compared. In one embodiment, these stored keys can include multiple redundant copies of each stored key. When a match is determined (i.e., when the number of copies of the stored key that match the input search key satisfies a threshold criterion), the location(s) of the matching storage key(s) in CAM block 252 points to a location of corresponding values in value data block 254 which can be retrieved and returned to the requestor. In one embodiment, memory device 130 is organized into multiple planes. In one embodiment, for example, memory device 130 includes four planes. In other embodiments, there can be more or fewer planes, however. Each of the planes can be configured to include one or more CAM blocks 252 and value data blocks 254.

Row decode circuitry 208 and column decode circuitry 210 are provided to decode address signals. Address signals are received and decoded to access the array of memory cells 250. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 250 in response to the commands and generates status information for the external memory sub-system controller 115, i.e., the local media controller 135 is configured to perform access operations (e.g., read operations, programming operations and/or erase operations) on the array of memory cells 250. The local media controller 135 is in communication with row decode circuitry 208 and column decode circuitry 210 to control the row decode circuitry 208 and column decode circuitry 210 in response to the addresses.

The local media controller 135 is also in communication with a cache register 242. Cache register 242 latches data, either incoming or outgoing, as directed by the local media controller 135 to temporarily store data while the array of memory cells 250 is busy writing or reading, respectively, other data. During a program operation (e.g., write operation), data may be passed from the cache register 242 to the data register 244 for transfer to the array of memory cells 250; then new data may be latched in the cache register 242 from the I/O control circuitry 212. During a read operation, data may be passed from the cache register 242 to the I/O control circuitry 212 for output to the memory sub-system controller 115; then new data may be passed from the data register 244 to the cache register 242. The cache register 242 and/or the data register 244 may form (e.g., may form a portion of) a page buffer of the memory device 130. A page buffer may further include sensing devices (not shown in FIG. 2) to sense a data state of a memory cell of the array of memory cells 250, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 242. The data may be subsequently written into data register 244 for programming the array of memory cells 250.

In an embodiment, cache register 242 may be omitted, and the data may be written directly into data register 244. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
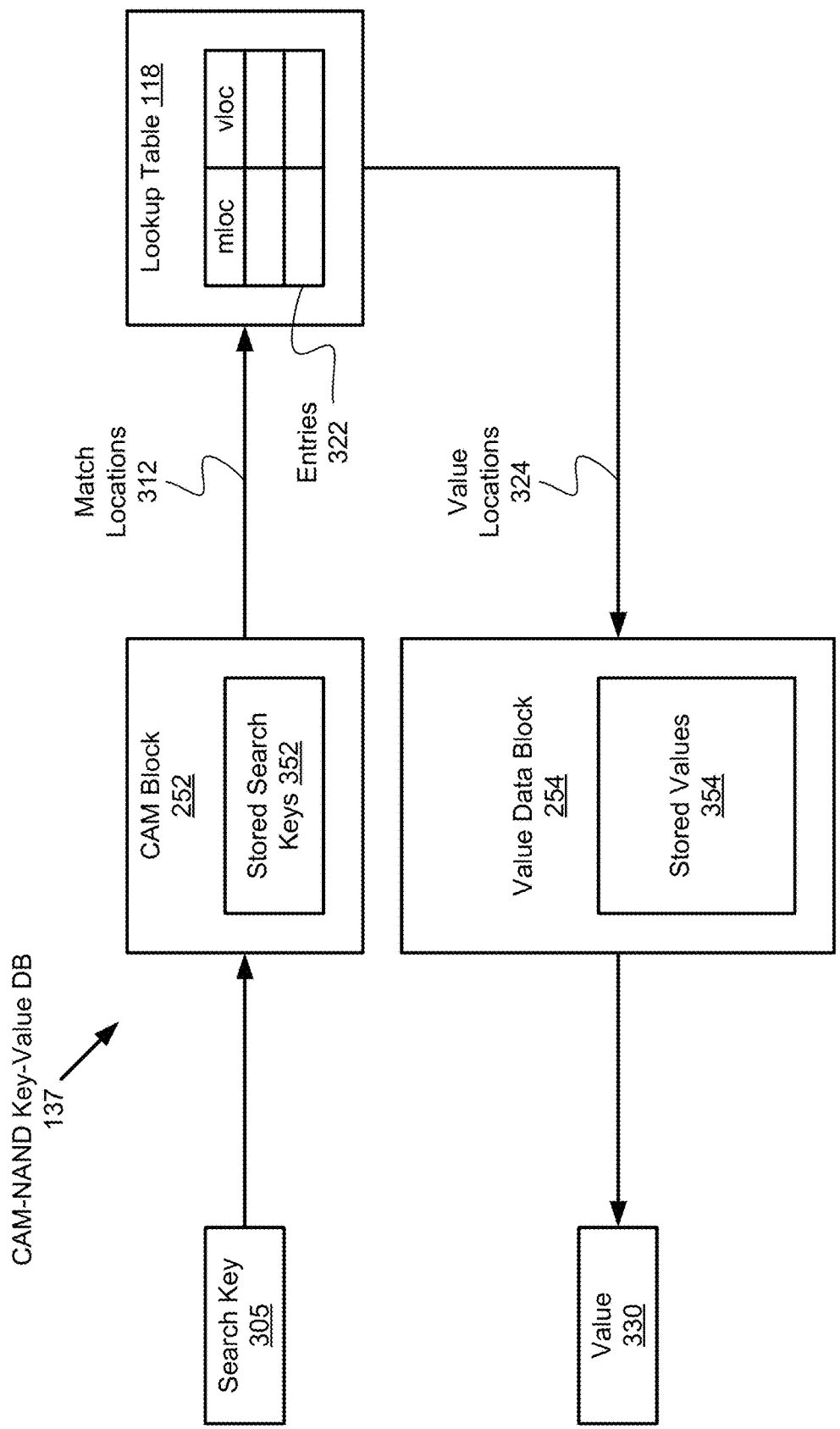
FIG. 3 is a block diagram illustrating a key-value data storage system using content addressable memory (CAM) in a memory sub-system in accordance with some embodiments of the present disclosure.

FIG. 3 is a block diagram illustrating a key-value data storage system using content addressable memory (CAM) in a memory sub-system, according to an embodiment. In one embodiment, the search component 113 receives an input search key 305 (e.g., a search word) and applies the input search key 305 to CAM block 252 to compare the input search key 305 to a number of stored search keys 352. In one embodiment, the search component 113, or other logic in memory sub-system 110, generates a search pattern based on the input search ley 305. The input search key 305 can include a first sequence of bits (e.g., "1011"). The generated search pattern can include a first set of voltage signals representing the input search key 305 and a second set of voltage signals representing a second sequence of bits comprising an inverse of the first sequence of bits (e.g., "0100"). In one embodiment, the search component 113 or other logic includes an inverter to generate an inverse of the input search key and a level selector to generate the first and second signals. In generating the first and second voltage signals, the level selector can use a high voltage to represent a binary value of "1" and use a low voltage to represent a binary value of "0" where the high voltage is above a threshold voltage (Vt) and the low voltage is below Vt.

To search CAM blocks 252, the search component 113 inputs the search key 305 (i.e., the representative search pattern) vertically along search lines of the CAM block 252. Input of the search key 305 causes any complementary memory cell pairs representing a matching stored bit value to become conductive. If a string is storing matching data (i.e. a matching one of stored search keys 352), the entire string becomes conductive. Match lines in the CAM block 252 are precharged (e.g., connected to the high voltage), and because the match lines are precharged, input of the search key 305 on the search lines causes any match lines in the block that are storing matching data (e.g., one of stored search keys 352 that is identical to the search key 305) to output a discharge signal because the corresponding string is conductive. The discharge signal provides an indication that matching data (e.g., the input search key 305) is stored thereon. The discharge signal provides an indication that matching data is stored on the string connected to the match line.

In one embodiment, stored search keys 352 includes multiple redundant copies of each stored key. For example, there can be three, four, five, or any other number of identical copies of a given stored key maintained in CAM block 252. The location of the multiple copies can vary depending on the embodiment. For example, in one embodiment, the copies can be stored anywhere in the CAM block 252 (e.g., on different blocks). In other embodiments, the copies can be stored in different sub-blocks associated with different respective page buffers or a single common page buffer within CAM block 252. In another embodiment, the copies can be stored adjacent to one another in the same sub-block of CAM block 252. In one embodiment, the multiple redundant copies of the stored key, even if associated with different sub-blocks, can all be associated with the same wordline in CAM block 252. In such an embodiment, wordline setup operations need only be performed once (i.e., for reading the first sub-block) and need not be performed to read the subsequent sub-blocks. This reduces the read time associated with identifying a matching stored key and improves performance in memory device 130.

Each string in CAM block 252 is connected between a match line and a page buffer (e.g., comprising one or more latch circuits) and the page buffer of a matched line stores data indicating matching data is stored along the matched line in response to the signal provided as a result of the match line discharging along the string. A page buffer can include one or more latch circuits. Physically, the page buffer(s) reside under or adjacent to the arrays of memory cells in which CAM block(s) 252 are implemented. A page buffer latches data based on the signal provided by a matched line when matching data is stored by the connected string that conducts the signal to the page buffer. In order to determine a match, the page buffer or other circuitry associated with CAM block 252 can identify a number of multiple redundant copies of each stored key that match the input search key. The search component 113 reads data from the page buffer(s) and provides an indicator of whether the input search key 305 is stored in CAM block 252 being searched as output along with one or more match locations 312 (e.g., memory addresses of the strings in the array).

In another embodiment, search component 113 or other logic in memory sub-system controller identifies the matching stored search keys. In such an embodiment, search component 113 reads data from the page buffer(s) indicating the matched lines with which a matching stored key is associated. In some embodiments, the search component 113 can sequentially search for matching data in the CAM block(s) 252 of multiple memory planes. In some embodiments, the search component 113 can search for matching data in the CAM block(s) 252 of the multiple memory planes in parallel. Parallel searching of the multiple memory planes allows all data entries stored among all CAM block(s) 252 of the planes to be searched in a single search operation rather than completing the search of all data entries in four separate search operations. Hence, parallel searching, as utilized in the embodiments described above, can allow the search component 113 to achieve an increase to search speed relative to embodiments in which sequential searching is utilized.

In some embodiments, data entries can be stored across two or more of the memory planes. In these instances, the search component 113 can simultaneously search for portions of matching data across two or more of the memory planes. Dividing data entries across planes allows for greater word size when compared to embodiments in which data entries are stored within a single plane. For example, if each of the CAM blocks 252 supports 64-bit words, dividing the data entries among all four planes would allow the memory device to support 256-bit words (4*64=256).

In one embodiment, the one or more match locations 312 can be applied as an input to a lookup table 118, or other data structure, storing the location of a value corresponding to the input search key 305 in a separate value store, such as value data block 254. The value data block 254 can be implemented in NAND-type flash memory (e.g., on memory device 130), or other non-volatile memory, which is not arranged using a CAM architecture, and can include a number of stored values 354. Depending on the embodiment, value data block 254 can be co-located on the same die as CAM block 252, or can be on a different memory device (i.e., memory die) in memory sub-system 110. In one embodiment, lookup table 118 is maintained on the same memory device 130 as either or both of CAM block 252 and value data block 254. In another embodiment, lookup table 118 is maintained on a separate memory device. In another embodiment, lookup table 118 is maintained, in its entirety or partially, in local memory 119 (e.g., DRAM) of memory sub-system controller 115. Lookup table 118 can include, for example, a number of entries 322 to associate various match locations 312 from CAM block 252 with other value locations 324 in value data block 254. In one embodiment, search component 113 can identify the entries 322 in the lookup table 118 corresponding to the match locations 312 and determine, from those entries, associated value locations 324 in the value data block 254 where the data (i.e., an associated one of stored values 354) corresponding to the input search key 305 is located. In one embodiment, the match locations 312 of each of the multiple redundant copies of a given stored search key are associated with a different value location 324 in the value data block 254. In one embodiment, one location in the value data block 254 includes one of stored values 354 associated with the stored key and an associated timestamp (e.g., indicating a time at which the key/value pair was stored at the memory sub-system). Any other locations in the value data block 254 (i.e., those locations associated with the remaining redundant copies of the stored key) can include the same timestamp while not including the associated value. In one embodiment, control logic compares the timestamps from each location in the value data block 254 to determine whether they match. If all of the timestamps (e.g., 3 of 3 timestamps) from each location in the value data block 254 match (i.e., indicate the same time), the value associated with the matching stored keys can be returned to a requestor that originally provided the input search key 305 (e.g., host system 120). If, for example, only a subset of the timestamps match (e.g., 2 of 3 timestamps), the value associated with the matching stored keys can be returned, and the CAM block 252 can be refreshed to address whatever change/error led to at least one timestamp not matching the other timestamps. If, for example, none of the timestamps match, the value associated with the matching stored keys is not returned and an error recovery flow is initiated, since there is low confidence that the value is correctly associated with the matching stored keys.

Figure 4:
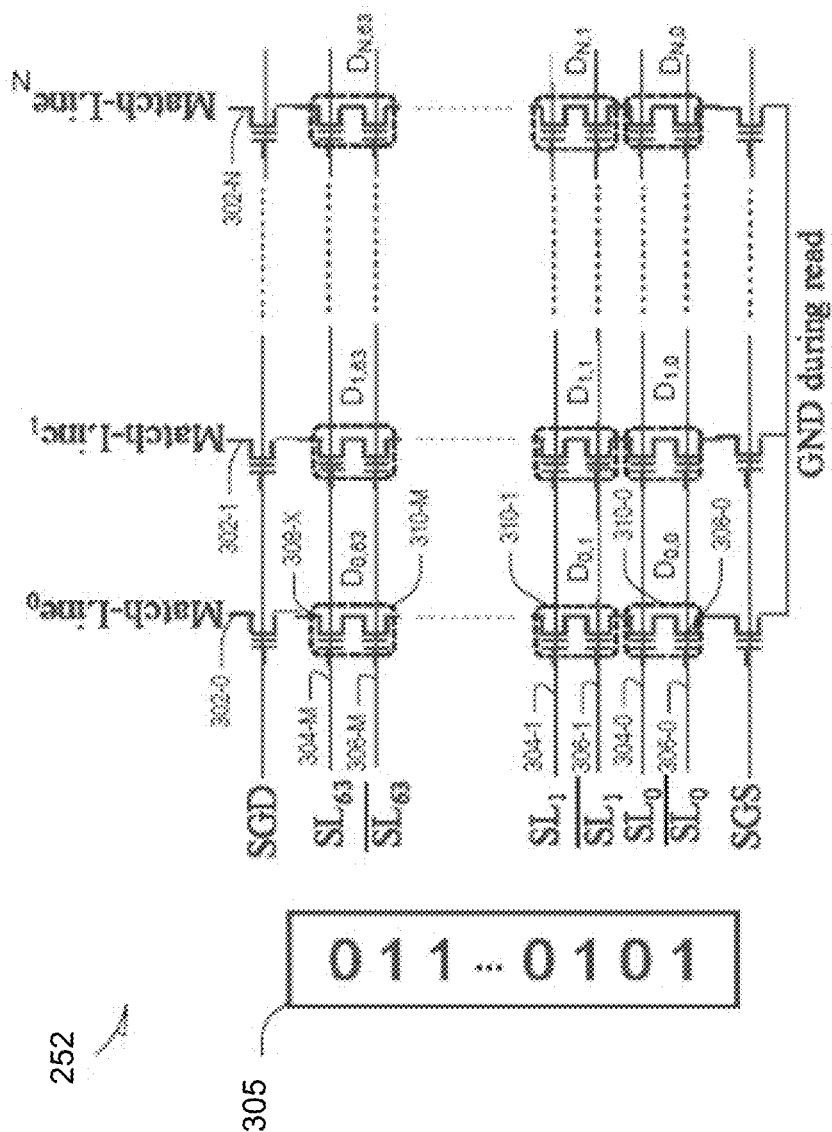
FIG. 4 is a block diagram of a content addressable memory (CAM) block of a key-value data storage system implemented within a memory device in accordance with some embodiments of the present disclosure.

FIG. 4 is a block diagram of a content addressable memory (CAM) block of a key-value data storage system implemented within a memory device in accordance with some embodiments of the present disclosure. As shown, the CAM block 252 includes match lines 302-0 to 302-N, search lines 304-0 to 304-M, and inverse search lines 306-0 to 306-M. In this implementation, the match lines 302-0 to 302-N of the CAM block 252 correspond to bit lines of the NAND-type flash memory device and the search lines 304-0 to 304-M and inverse search lines 306-0 to 306-M of the CAM block 252 correspond to word lines of the NAND-type flash memory device.

Each of the match lines 302-0 to 302-N is connected to a string comprising a plurality of memory cells connected in series. For example, match line 302-0 is connected to a string comprising memory cells 308-0 to 308-X, where X=2M. Memory cells in each string of the CAM block 252 are configured to be complementary pairs. For example, with the string connected to match line 302-0, memory cells 308-0 to 308-X are programmed as complementary memory cell pairs 310-0 to 310-M.

Memory cell pairs are configured to be complementary in that one memory cell in the pair stores a data value ("0") and the other memory cell in the pair stores an inverse of the data value ("1"). For example, memory cell pair 310-0 comprises two memory cells. A first memory cell stores a data bit value DATA, and a second memory cell 308-0 stores $\overline{DATA}$, which is an inverse of the data bit value DATA. Also, as shown, search line 304-0 is connected to a control gate of the first memory cell and inverse search line 306-0 is connected to a control gate of the second memory cell.

Search line 304-0 receives a first signal SL representing a search bit value from an input search word and inverse search line 306-0 receives a second signal $\overline{SL}$ representing an inverse of the search bit value. If SL matches DATA and $\overline{SL}$ matches $\overline{DATA}$, the memory cell pair 310-0 will be conductive from A to B. For example, TABLE 1 provided below is a truth table that defines the behavior of any given one of the memory cell pairs 310-0 to 310-M.

TABLE 1

| SL | $\overline{SL}$ | DATA | $\overline{DATA}$ | CONDUCTIVE |
|----|-----------------|------|-------------------|------------|
| 0  | 1               | 0    | 1                 | YES        |
| 0  | 1               | 1    | 0                 | NO         |
| 1  | 0               | 0    | 1                 | NO         |
| 1  | 0               | 1    | 0                 | YES        |

In TABLE 1, "SL" is a search bit value, "$\overline{SL}$" is an inverse of the search bit value, "DATA" is a stored bit value, and "$\overline{DATA}$" is an inverse of the stored bit value. As shown, a complementary cell pair is conductive when the search data value matches the stored data value and the inverse of the search data value matches the inverse of the stored data value. In other instances, the memory cell pair 310 is non-conductive because the stored data does not match the search bit.

In one embodiment, each string in the CAM block 252 stores a data entry and each data bit value in a data entry is mapped to one of the memory cell pairs 310-0 to 310-M in the string. In this way, within each of the complementary memory cell pairs 310 in a string, a first memory cell stores a bit value from the data entry and a second memory cell stores an inverse of the bit value from the data entry.

In an example where the NAND-type flash memory device supports 128 bit strings (i.e., X is 128), the match line 302-0 is connected to memory cells 308-0 to 308-127, which stores 64 bit data entry comprising bit values $D_{0,0}$-$D_{63,63}$. In this example, bit value $D_{0,0}$ is mapped to memory cell pair 310-0 comprising memory cells 308-0 and 308-1. More specifically, memory cell 308-0 stores the bit value $D_{0,0}$ and the complementary memory cell stores $\overline{D_{0,0}}$, which is the inverse of the bit value $D_{0,0}$.

A search pattern 305 may be input vertically along search lines 304-0 to 304-M and inverse search lines 306-0 to 306-M. More specifically, search lines 304-0 to 304-M receive a first set of voltage signals $SL_{0-M}$ representing a search word 305, and inverse search lines 306-0 to 306-M receive a second set of voltage signals $\overline{SL}_{0-M}$ representing an inverse of the search word. Input of the search pattern 305 along the search lines causes any string that stores matching data to be conductive because, as discussed above, each individual memory cell pair 310 in the string will be conductive. Because the match lines 302 are precharged, a conductive string allows the match line 302 to discharge. A page buffer connected to a conductive string latches data that indicates a location of matching data (i.e., the search word 206) in the CAM block 252.

The search component 113 outputs an indication of whether a search word 206 is stored by the CAM block 252 and an indicator of the location (e.g., a memory address) of the matching data. In some embodiments, the search component 113 comprises a read-out circuit that reads data from the page buffers of the CAM block 252 to identify the location thereof.

In some embodiments, two page buffers in the CAM block 252 can be tied together to form a serial shift register. Consistent with these embodiments, the search component 113 shifts data out of a first page buffer to a second page buffer and the search component 113 comprises an output compare and counter component to track the number of shifts from one page buffer to the other to identify the location of matching data stored by the CAM block 252. In some embodiments, two page buffers may be tied together using a single or multiple transistors to form a shift register.

Figure 5:
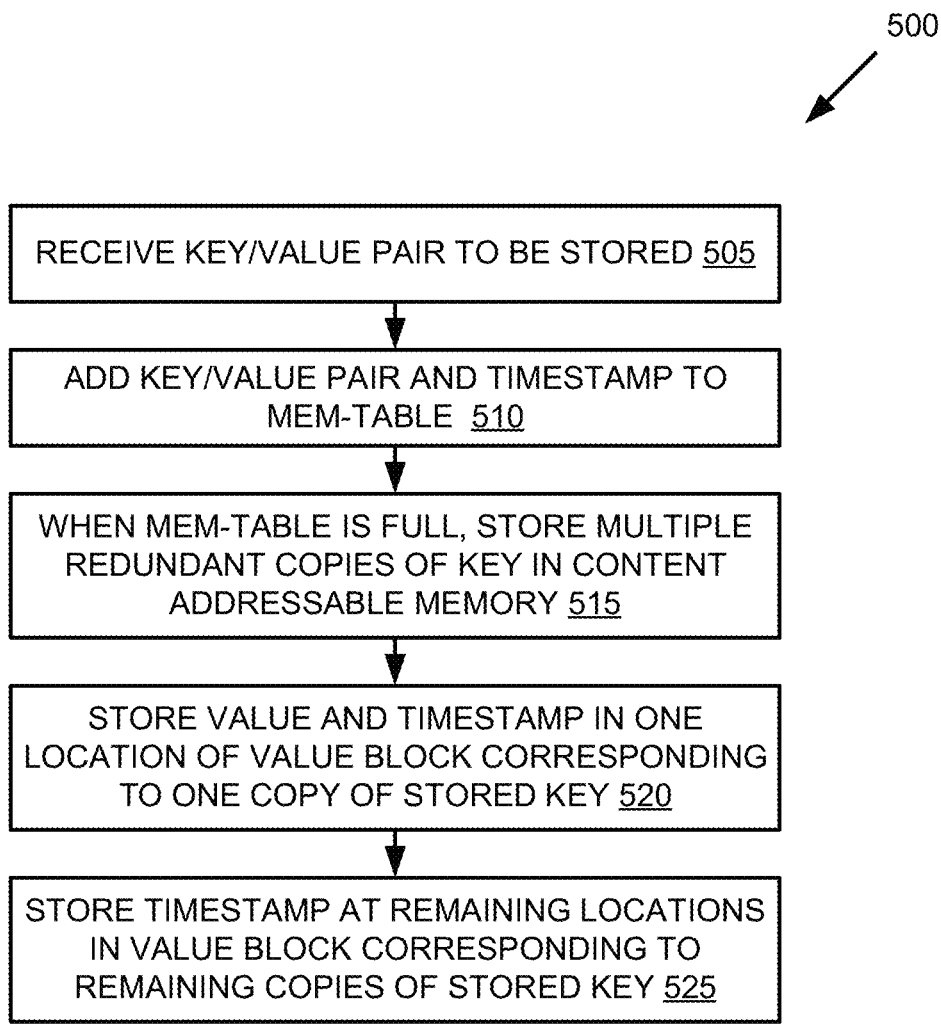
FIG. 5 is a flow diagram of an example method of storing data key-value data in a memory sub-system implementing copy redundancy using CAM in accordance with some embodiments of the present disclosure.

FIG. 5 is a flow diagram of an example method of storing data key-value data in a memory sub-system implementing copy redundancy using CAM in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by search component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, data is received. For example, processing logic (e.g., search component 113) can receive the data from a requestor (e.g., host system 120). In one embodiment, the data includes a key-value pair to be stored in CAM-NAND key-value database 137. As described herein, the key-value pair can include a search key (e.g., including a unique sequence of bits) and a corresponding value, which can include data in any form.

At operation 510, the data is stored. For example, the processing logic can store the key/value pair in a mem-table at memory sub-system 110. In one embodiment, the mem-table is a data structure used to temporarily store or cache data before such data is written to CAM-NAND key-value database 137, and can be implemented, for example, in local memory 119. In one embodiment, a timestamp is also stored with the key/value pair. The timestamp can include digital date and/or time information, a counter value, or some other information indicating at least one of when the key/value pair was received, when the key/value pair was stored in the mem-table, or the occurrence of some other event related to the key/value pair.

At operation 515, the data is moved. For example, when the mem-table is full or otherwise reaches a threshold capacity or amount of data, the processing logic can flush the data from the mem-table to CAM-NAND key-value database 137. In one embodiment, the processing logic can store multiple redundant copies of the search key in a CAM block, such as CAM block 252, which includes an array (e.g., a NAND-type flash memory array) of memory cells. The memory cells can be organized into a plurality of strings, with each string storing one of a plurality of stored search keys. A string includes a plurality of memory cells connected in series between a precharged match line and a page buffer. The match line is precharged in that it is connected to a voltage signal (e.g., representing a logical high state). The CAM block further comprises a plurality of search lines, and each of the memory cells in a string are connected to one of a plurality of search lines. In one embodiment, each redundant copy of the search key is stored on a different one of the plurality of strings and thus has a different associated match location 312.

At operation 520, the value is stored. For example, the processing logic can store the value from the key-value pair and the associated timestamp at a value location 324 in value data block 254. In one embodiment, each of the multiple redundant copies of the stored key in the CAM is associated with a different location in the value data block 254. The value location 324 including the value and the associated timestamp can correspond to the match location 312 of any one of the redundant copies of the stored search key in CAM block 252.

At operation 525, timestamps are stored. As described herein, each of the multiple redundant copies of the stored key in the CAM is associated with a different location in the value data block 254. With the value and associated timestamp stored at one location in value data block 254, there can be a number of remaining locations associated with the remaining copies of the stored key. In one embodiment, the processing logic can store a copy of the same timestamp at those remaining locations in value data block 254. Those remaining locations need not store a copy of the value, although they can store a copy of the value if capacity is not constrained. As described herein, the timestamps in value data block 254 can be used to assess the validity and health of the CAM block 252 storing the associated stored search keys.

Figure 6:
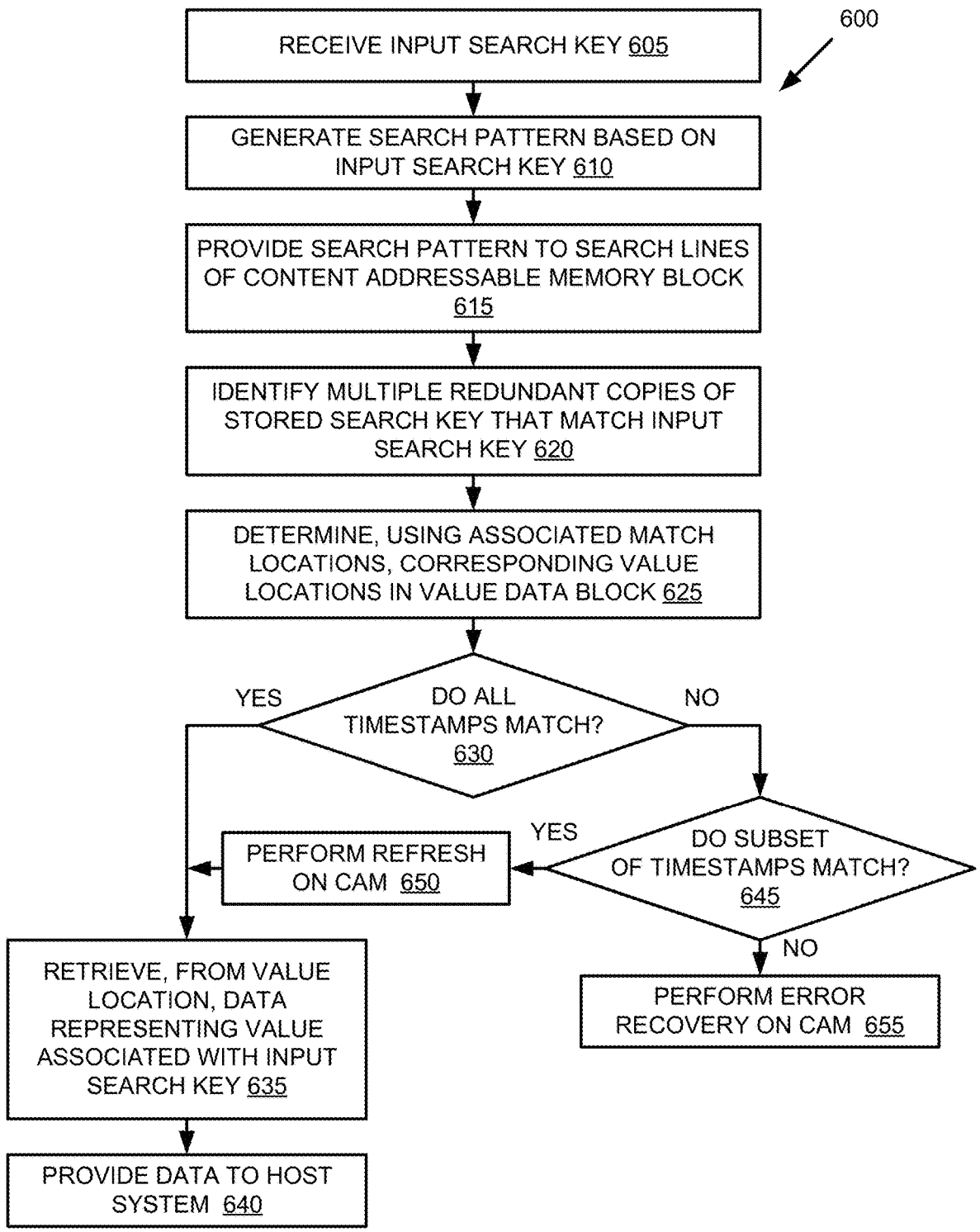
FIG. 6 is a flow diagram of an example method of processing a search operation in memory sub-system implementing copy redundancy for a key-value data storage system using CAM in accordance with some embodiments of the present disclosure.

FIG. 6 is a flow diagram of an example method of processing a search operation in memory sub-system implementing redundancy and majority voting for a key-value data storage system using CAM in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by search component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, an input search key is received. For example, processing logic (e.g., search component 113) can receive the input search key 305 from a requestor (e.g., host system 120). In one embodiment, the input search key includes a first sequence of bits (e.g., "1001 1010 1011").

At operation 610, a search pattern is generated. For example, the processing logic can generate a search pattern based on the first sequence of bits. In one embodiment, the search pattern comprises first set of voltage signals representing the input search key 305. That is, the first set of voltage signals represents the first sequence of bits. The search pattern further comprises a second set of voltage signals representing a second sequence of bits comprising an inverse of the first sequence of bits (e.g., "0110 0101 0100"). Accordingly, in generating the search pattern, the processing logic generates the second sequence of bits by inverting the input search key 305 and converts the first and second sequence of bits into the first and second sets of voltage signals, respectively. The processing logic may alternatively generate a first set of voltage signals based on the first sequence of bits and generate the second set of voltage signals by generating an inverse of the first set of voltage signals. In generating the first and second sets of voltage signals, the processing logic may use a high voltage to represent a binary value of "1" and use a low voltage to represent a binary value of "0" where the high voltage is above a threshold voltage (Vt) and the low voltage is below Vt.

At operation 615, the search pattern is provided to a CAM block. In one embodiment, the CAM block, such as CAM block 252, includes an array (e.g., a NAND-type flash memory array) of memory cells. The memory cells can be organized into a plurality of strings, with each string storing one of a plurality of stored search keys. A string includes a plurality of memory cells connected in series between a precharged match line and a page buffer. The match line is precharged in that it is connected to a voltage signal (e.g., representing a logical high state). The CAM block further comprises a plurality of search lines, and each of the memory cells in a string are connected to one of a plurality of search lines. In one embodiment, the CAM block includes multiple redundant copies of each stored search key.

As noted above, the memory cells in each string are organized as complementary memory cell pairs. Each bit value of a data entry stored by a string is mapped to a complementary memory cell pair in the string. In particular, a first memory cell stores the bit value and the second memory cell stores the inverse of the bit value. More specifically, a first memory cell stores a first charge representing the bit value and the second memory cell stores a second charge representing the inverse of the bit value. In providing the search pattern to the search lines of the CAM block 252, the processing logic can provide a first signal representing a search bit value from the first bit sequence to a first search line connected to a first memory cell in a complementary memory cell pair and provide a second search signal representing an inverse of the search bit value to a second search line connected to a second memory cell in the complementary memory cell pair.

Figure 7:
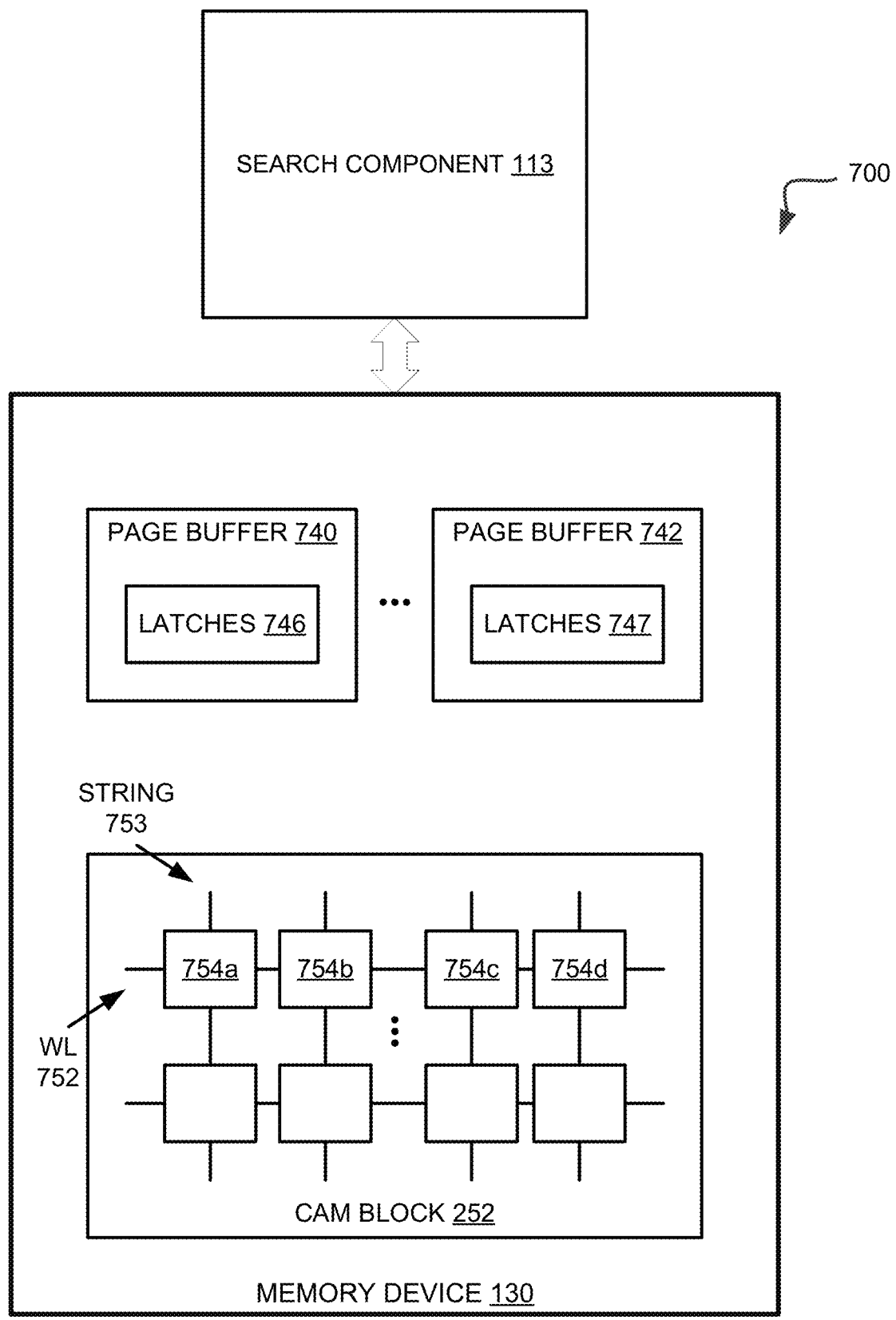
FIG. 7 is a block diagram illustrating a memory sub-system implementing copy redundancy in a key-value data storage system using CAM in accordance with some embodiments of the present disclosure.

FIG. 7 is a block diagram 700 illustrating a memory sub-system implementing copy redundancy in a key-value data storage system using CAM in accordance with some embodiments of the present disclosure. In one embodiment, search component 113 is operatively coupled with memory device 130. In one embodiment, memory device 130 includes a number of page buffers, such as page buffer 740 and page buffer 742, and CAM block 252. CAM block 252 can include an array of memory cells formed at the intersections of wordlines, such as wordline 752, and bitlines (not shown). A given bit line can be coupled to multiple memory strings, such as string 753. In one embodiment, the memory cells are grouped in to blocks, which can be further divided into sub-blocks, where a given wordline, such as wordline 752, is shared across a number of sub-blocks 754a, 754b, 754c, 754d, for example, with each sub-block corresponding to a different memory string. In another embodiment, each sub-block corresponds to a different bitline. In another embodiment, each sub-block corresponds to a separate plane in the CAM block 252. The group of memory cells associated with a wordline within a sub-block is referred to as a physical page. Each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible. The page buffers (e.g., 740, 742) are used to temporarily store data being read from or written to CAM block 252 of memory device 130, and can include a cache register, one or more data registers, as well as any number of additional latches. For example, page buffer 740 includes set of latches 746 and page buffer 742 includes set of latches 747.

Depending on the embodiment, the location of the multiple redundant copies of the stored key within CAM block 252 can vary. For example, in one embodiment, the copies can be stored anywhere in the CAM (e.g., on different blocks). In other embodiments, the copies can be stored in different sub-blocks, such as sub-blocks 754a-754d. In one embodiment, the sub-blocks 754a-754d on which the multiple redundant copies of the stored key are stored, are each associated a single common page buffer, such as page buffer 740. In another embodiment, two or more of the sub-blocks 754a-754d on which the multiple redundant copies of the stored key are stored (e.g., each of the sub-blocks 754a-754d), are each associated with different respective page buffers, such as page buffer 740 and 742. In yet another embodiment, the multiple redundant copies of the stored key are stored can be stored adjacent to one another in the same sub-block, such as sub-block 754a.

Referring again to FIG. 6, at operation 620, stored search keys are identified. For example, the processing logic can identify multiple redundant copies of a stored search key, such as from stored search keys 352, which match the input search key 305. In one embodiment, the processing logic can determine whether any of stored search keys 352 match the input search key 305 by reading data from the page buffer, such as one or more page buffers 640 and 642 of CAM block 252. If the input search key 305 matches one of the multiple redundant copies stored in the CAM block 252, input of the search pattern causes the string on which the matching stored key is stored to become conductive. Because matched lines are precharged, the conductive string allows the match line to discharge. That is, the string conducts a signal resulting from the match line discharging based on the input search key 305 matching the stored search key on the string connected to the match line. The conductive string provides the signal to the page buffer connected at the other end of the string. The page buffer latches data (e.g., into latches 646 or 647) in response to the signal provided as a result of the match line discharging. The latched data indicates that the match line connected to the page buffer stores a data entry that is identical to the input search key 305.

At operation 625, corresponding value locations are determined. The multiple redundant copies from the plurality of stored search keys 352 each have an associated respective match location 312 in the CAM block 252. In one embodiment, the processing logic can determine the respective match locations based on the data read from the page buffer. Match location 312, for example, can include one or more memory addresses corresponding to one or more strings within the array of CAM block 252. In one embodiment, the processing logic can determine, using the associated match locations 312, corresponding value locations 324 in the value data block 254. In one embodiment, the processing logic utilizes a lookup table 118 comprising a plurality of entries 322. Each entry of the plurality of entries 322 associates a match location (e.g., match location 312) from the CAM block 252 with a value location (e.g., value location 324) in the value data block 254 where data representing a value (e.g., value 330) corresponding to a respective stored search key from the CAM block 252 is stored. Depending on the embodiment, the lookup table 118 can be maintained in NAND-type flash memory of memory device 130 or in dynamic random access memory (DRAM) elsewhere in memory sub-system 110 (e.g., in local memory 119). In one embodiment, to determine the corresponding value locations 324 in the value data block 254, the processing logic can identify entries of the plurality of entries 322 in the lookup table 118 corresponding to the associated match locations 312 and associating the associated match locations 312 with the corresponding value locations 324. In one embodiment, one of the value locations 324 in the value data block 254 includes a first timestamp and data representing a value associated with the input search key. A remainder of the value locations 324 in the value data block 254 (i.e., those value locations associated with a match location 312 of one of the multiple redundant copies of the stored search key in CAM block 252) includes one or more additional timestamps.

At operation 630, a comparison is performed. For example, the processing logic can read the timestamps from each of the value locations 324 in value data block 254 and compare them to one another to determine if the timestamps match (i.e., indicate the same time/date/counter value). The processing logic can determine if all of the timestamps match. For example, if there are three redundant copies of the stored search key in CAM block 252, each key can point to a different location in value data block 254, thus resulting in three timestamps being compared.

If it is determined at operation 630 that all of the timestamps match, at operation 635, data representing a value is retrieved. For example, the processing logic can retrieve, from one of the value locations 324 in the value data block 254, data representing one of stored values 354 (i.e., value 330) associated with the input search key 305.

At operation 640, data is provided to a requestor. For example, the processing logic can provide the data representing the value 330 associated with the input search key 305 to a host system (e.g. host system 120). In another embodiment, the processing logic can provide some other data, such as an address or offset corresponding to the value location 324 to the host system. In such an embodiment, a secondary access (e.g., a prefix-search) can be performed to retrieve the value 330 from the value location 324.

If it is determined at operation 630 that all of the timestamps do not match, at operation 645, the processing logic can determine whether a subset of the timestamps match. For example, if there are three timestamps and two of the three timestamps match, processing logic can determine that a subset of the timestamps match.

If it is determined at operation 645 that a subset of the timestamps match, the data representing the value can be retrieved and provided to the requestor, as indicated at operations 635 and 640, and at operation 650, a refresh operation can be performed. For example, the processing logic can perform a refresh operation on CAM block 252. In one embodiment, to perform the refresh operation, the processing logic can cause all of the data (i.e., stored search keys 352) to be read from CAM block 252 (e.g., using a modified SLC read operation), correct each page using read offsets, soft data, and error-correcting codes (e.g., LDPC), and write the data to a new CAM block. Depending on the embodiment, the refresh operation can be performed either before, after, or concurrently (i.e., at least partially overlapping in time) with the retrieval and providing of the value.

If it is determined at operation 645 that a subset of the timestamps do not match (i.e., that none of the timestamps match), at operation 655, an error recovery operation is performed. For example, the processing logic can perform an error recovery operation on CAM block 252. In one embodiment, to perform the error recovery operation, the processing logic can perform a number of re-read operations using different high and low voltages. For example, the processing logic can cause a first re-read of the data from CAM block 252 to be performed using a default low voltage, a second re-read to be performed using a lower low voltage, a third re-read to be performed using a higher low voltage, fourth re-read to be performed using a default low voltage with a higher high voltage, a fifth re-read to be performed using a lower low voltage and a higher high voltage, and a sixth re-read to be performed using a higher low voltage and a higher high voltage. The processing logic can then cause all of the data (i.e., stored search keys 352) to be read from CAM block 252 (e.g., using a modified SLC read operation), correct each page using read offsets, soft data, and error-correcting codes (e.g., LDPC), and write the data to a new CAM block.

Figure 8:
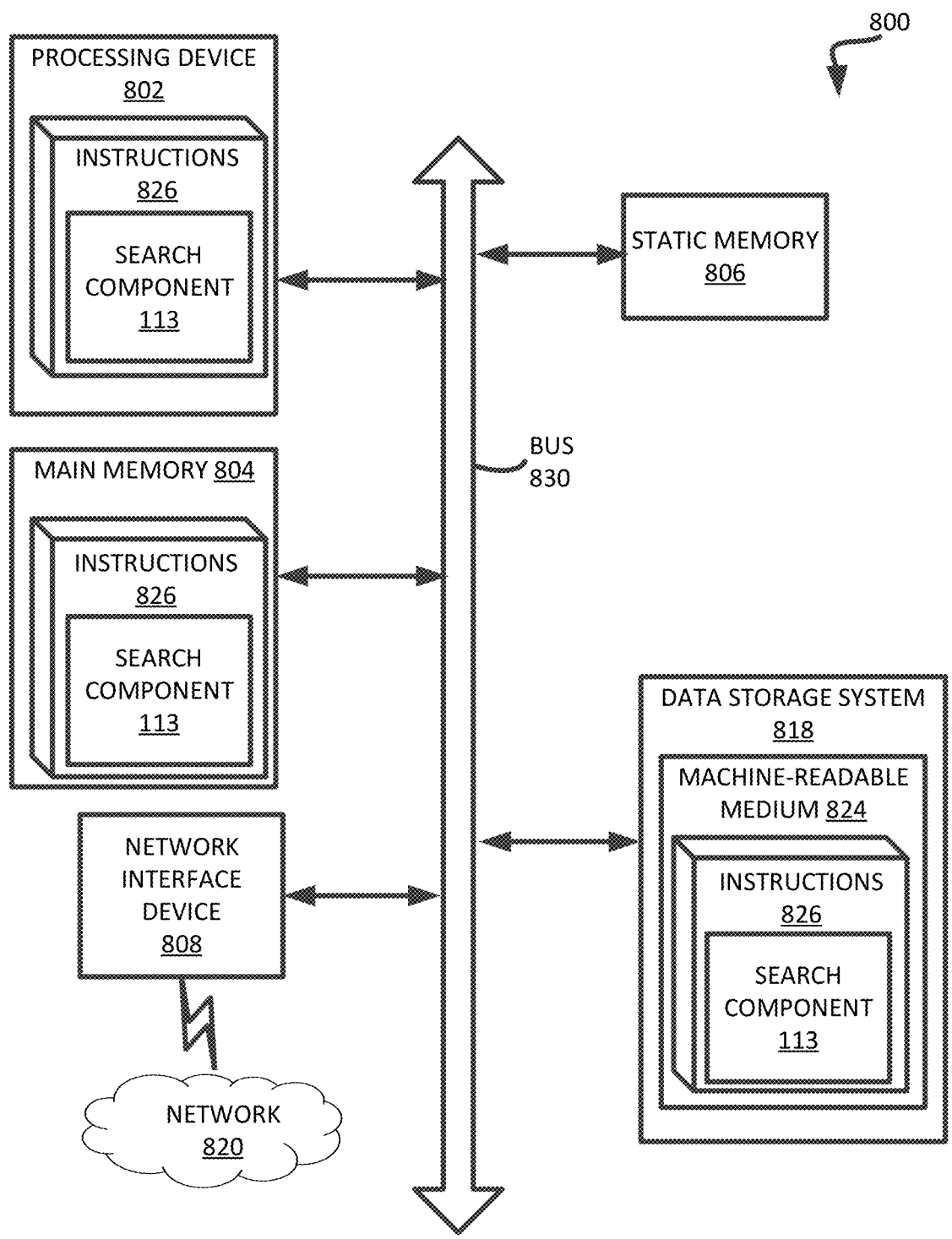
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to search component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to search component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device comprising a value data block and a content addressable memory (CAM) block storing a plurality of stored search keys; and
   a processing device, operatively coupled with the memory device, to perform operations comprising:
   receiving an input search key;
   identifying, from the plurality of stored search keys in the CAM block, multiple redundant copies of a stored search key that match the input search key;
   determining a plurality of locations in the value data block, the plurality of locations corresponding to the multiple redundant copies, wherein one of the plurality of locations comprises a first timestamp and data representing a value associated with the input search key, and wherein a remainder of the plurality of locations comprises one or more additional timestamps;
   determining whether the first timestamp matches the one or more additional timestamps; and
   responsive to the first timestamp matching the one or more additional timestamps, retrieving from the one of the plurality of locations, the data representing the value associated with the input search key.

2. The system of claim 1, wherein the processing device is to perform operations further comprising:
   responsive to the first timestamp matching only a subset of the one or more additional timestamps, retrieving, from the one of the plurality of locations, the data representing the value associated with the input search key and performing a refresh operation on the CAM block.

3. The system of claim 1, wherein the processing device is to perform operations further comprising:
   responsive to the first timestamp not matching any of the one or more additional timestamps, performing an error recovery operation on the CAM block.

4. The system of claim 1, wherein the CAM block comprises an array of memory cells organized into a plurality of strings, each string storing one of the plurality of stored search keys and comprising a plurality of memory cells connected in series between a precharged match line and a page buffer, wherein each of the plurality of memory cells is connected to one of a plurality of search lines.

5. The system of claim 4, wherein the input search key comprises a first sequence of bits, and wherein the processing device is to perform operations further comprising:
   generating a search pattern based on the first sequence of bits, the search pattern comprising a first set of voltage signals representing the first sequence of bits and a second set of voltage signals representing a second sequence of bits comprising an inverse of the first sequence of bits.

6. The system of claim 5, wherein the processing device is to perform operations further comprising:
   providing the search pattern as an input to the plurality of search lines of the CAM block, wherein the search pattern to cause at least one string of the plurality of strings storing the one of the plurality of stored search keys that matches the input search key to be conductive and provide a signal to the page buffer in response to the input search key matching the one of the plurality of stored search keys stored on the at least one string, the signal resulting from the precharged match line discharging, and the page buffer storing data based on the signal.

7. The system of claim 1, wherein the memory device comprises a negative and (NAND) type flash memory device, wherein each of the multiple redundant copies of the stored search key has an associated respective match location in the CAM block, and wherein the associated respective match locations in the CAM block comprise memory addresses of respective strings on the NAND type flash memory device.

8. The system of claim 7, further comprising:
a lookup table comprising a plurality of entries, wherein each entry of the plurality of entries associates the associated respective match locations from the CAM block with a value location in the value data block where data representing the value corresponding to the multiple redundant copies of the stored search key from the CAM block is stored.

9. The system of claim 8, wherein determining the plurality of locations in the value data block comprises identifying entries in the lookup table corresponding to the associated respective match locations.

10. A method comprising:
receiving an input search key;
identifying, from the plurality of stored search keys in a CAM block of a memory device, multiple redundant copies of a stored search key that match the input search key;
determining a plurality of locations in a value data block, the plurality of locations corresponding to the multiple redundant copies, wherein one of the plurality of locations comprises a first timestamp and data representing a value associated with the input search key, and wherein a remainder of the plurality of locations comprises one or more additional timestamps;
determining whether the first timestamp matches the one or more additional timestamps; and
responsive to the first timestamp matching the one or more additional timestamps, retrieving from the one of the plurality of locations, the data representing the value associated with the input search key.

11. The method of claim 10, further comprising:
responsive to the first timestamp matching only a subset of the one or more additional timestamps, retrieving, from the one of the plurality of locations, the data representing the value associated with the input search key and performing a refresh operation on the CAM block.

12. The method of claim 10, further comprising:
responsive to the first timestamp not matching any of the one or more additional timestamps, performing an error recovery operation on the CAM block.

13. The method of claim 10, wherein the memory device comprises a negative and (NAND) type flash memory device, wherein each of the multiple redundant copies of the stored search key has an associated respective match location in the CAM block, and wherein the associated respective match locations in the CAM block comprise memory addresses of respective strings on the NAND type flash memory device.

14. The method of claim 13, wherein determining the plurality of locations in the value data block comprises identifying entries in a lookup table corresponding to the associated respective match locations, wherein lookup table comprising a plurality of entries, and wherein each entry of the plurality of entries associates the associated respective match locations from the CAM block with a value location in the value data block where data representing the value corresponding to the multiple redundant copies of the stored search key from the CAM block is stored.

15. A non-transitory machine readable storage medium storing instructions that, when executed by a processing device, cause the processing device to perform operations comprising:
receiving an input search key;
identifying, from the plurality of stored search keys in a CAM block of a memory device, multiple redundant copies of a stored search key that match the input search key;
determining a plurality of locations in a value data block, the plurality of locations corresponding to the multiple redundant copies, wherein one of the plurality of locations comprises a first timestamp and data representing a value associated with the input search key, and wherein a remainder of the plurality of locations comprises one or more additional timestamps;
determining whether the first timestamp matches the one or more additional timestamps; and
responsive to the first timestamp matching the one or more additional timestamps, retrieving from the one of the plurality of locations, the data representing the value associated with the input search key.

16. The non-transitory machine readable storage medium of claim 15, wherein the instructions cause the processing device to perform operations further comprising:
responsive to the first timestamp matching only a subset of the one or more additional timestamps, retrieving, from the one of the plurality of locations, the data representing the value associated with the input search key and performing a refresh operation on the CAM block.

17. The non-transitory machine readable storage medium of claim 15, wherein the instructions cause the processing device to perform operations further comprising:
responsive to the first timestamp not matching any of the one or more additional timestamps, performing an error recovery operation on the CAM block.

18. The non-transitory machine readable storage medium of claim 15, wherein the memory device comprises a negative and (NAND) type flash memory device, wherein each of the multiple redundant copies of the stored search key has an associated respective match location in the CAM block, and wherein the associated respective match locations in the CAM block comprise memory addresses of respective strings on the NAND type flash memory device.

19. The non-transitory machine readable storage medium of claim 18, wherein determining the plurality of locations in the value data block comprises identifying entries in a lookup table corresponding to the associated respective match locations.

20. The non-transitory machine readable storage medium of claim 19, wherein the lookup table comprising a plurality of entries, and wherein each entry of the plurality of entries associates the associated respective match locations from the CAM block with a value location in the value data block where data representing the value corresponding to the multiple redundant copies of the stored search key from the CAM block is stored.

* * * * *